(12) United States Patent
Nemeth et al.

(10) Patent No.: US 10,714,652 B2
(45) Date of Patent: Jul. 14, 2020

(54) METHODS OF FORMING INTERDIGITATED BACK CONTACT LAYERS

(71) Applicant: Alliance for Sustainable Energy, LLC, Golden, CO (US)

(72) Inventors: William Michael Nemeth, Wheat Ridge, CO (US); Pauls Stradins, Golden, CO (US); Vincenzo Anthony LaSalvia, Conifer, CO (US); Matthew Robert Page, Littleton, CO (US); David Levi Young, Golden, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 16/014,695

(22) Filed: Jun. 21, 2018

(65) Prior Publication Data

US 2018/0374984 A1 Dec. 27, 2018

Related U.S. Application Data

(60) Provisional application No. 62/522,777, filed on Jun. 21, 2017.

(51) Int. Cl.

| *H01L 31/18* | (2006.01) |
|---|---|
| *H01L 31/0224* | (2006.01) |
| *H01L 31/077* | (2012.01) |
| *H01L 31/068* | (2012.01) |
| *H01L 31/0745* | (2012.01) |

(52) U.S. Cl.
CPC .... *H01L 31/182* (2013.01); *H01L 31/022441* (2013.01); *H01L 31/022458* (2013.01); *H01L 31/0682* (2013.01); *H01L 31/077* (2013.01); *H01L 31/0745* (2013.01); *H01L 31/1804* (2013.01); *H01L 31/1872* (2013.01)

(58) Field of Classification Search
CPC .......... H01L 31/182; H01L 31/022441; H01L 31/022458; H01L 31/0682; H01L 31/0745; H01L 31/077; H01L 31/1804; H01L 31/1872
See application file for complete search history.

(56) References Cited

U.S. PATENT DOCUMENTS

| 4,897,123 A | 1/1990 | Mitsui |
|---|---|---|
| 6,166,320 A | 12/2000 | Nagashima et al. |

(Continued)

OTHER PUBLICATIONS

Almansouri, I. et al., "Supercharging Silicon Solar Cell Performance by Means of Multijunction Concept," IEEE Journal of Photovoltaics, vol. 5, No. 3, May 2015, pp. 968-976.

(Continued)

*Primary Examiner* — Matthew C Landau
*Assistant Examiner* — Dmitriy Yemelyanov
(74) *Attorney, Agent, or Firm* — Sam J. Barkley

(57) ABSTRACT

Methods of forming interdigitated back contact (IBC) layers are provided. According to an aspect of the invention, a first layer having alternating regions of n-type amorphous hydrogenated silicon and p-type amorphous hydrogenated silicon is formed on a second layer of intrinsic amorphous hydrogenated silicon. The first layer and the second layer are then annealed, such that dopants from the first layer diffuse into the second layer, and the first layer and the second layer crystallize into polysilicon.

3 Claims, 8 Drawing Sheets a) Blanket i/a-Si:H + SiNx b) Pattern + Etch

(56) References Cited

U.S. PATENT DOCUMENTS

| | | | |
|---|---|---|---|
| 6,340,788 | B1 | 1/2002 | King et al. |
| 8,242,354 | B2 | 8/2012 | Smith |
| 8,614,395 | B1 | 12/2013 | Nielson et al. |
| 2010/0307591 | A1 | 12/2010 | Bedell et al. |
| 2012/0107997 | A1 | 5/2012 | Kim et al. |
| 2012/0305072 | A1 | 12/2012 | Fujimori et al. |
| 2014/0209149 | A1 | 7/2014 | Mascarenhas et al. |
| 2014/0295613 | A1* | 10/2014 | O'Sullivan ........... H01L 31/028 438/87 |
| 2015/0162478 | A1 | 6/2015 | Fafard et al. |
| 2015/0162483 | A1* | 6/2015 | Weidman ............... H01L 31/182 136/256 |
| 2016/0020342 | A1* | 1/2016 | Heng .............. H01L 31/022441 136/256 |
| 2018/0374977 | A1 | 12/2018 | Geerligs et al. |

OTHER PUBLICATIONS

Bush, K. et al., "23.6%-efficient monolithic perovskite/silicon tandem solar cells with improved stability," Nature Energy, vol. 2, 2017, pp. 1-7.

Cariou, R. et al., "Monolithic Two-Terminal III-V//Si Triple-Junction Solar Cells With 30.2% Efficiency Under 1-Sun AM 1.5g," IEEE Journal of Photovoltaics, vol. 7, No. 1, Jan. 2016, pp. 367-373.

Deppe, D.G., "Thermodynamic explanation to the enhanced diffusion of base dopant in AlGaAs—GaAs npn bipolar transistors," American Institute of Physics, vol. 56, No. 370, 1990, 3 pages.

Das, U. et al., "The role of back contact patterning on stability and performance of Si IBC heterojunction solar cells," IEEE, 2014, pp. 0590-0593.

Duong, T., "Rubidium Multication Perovskite with Optimized Bandgap for Perovskite-Silicon Tandem with over 26% Efficiency," Advanced Energy Materials, vol. 7, 2017, 11 pages.

Essig, S. et al., "Progress towards a 30% efficient GaInP/Si tandem solar cell," Energy Procedia, vol. 77, 2015, pp. 464-469.

Essig, S. et al., "Realization of GaInP/Si Dual-Junction Solar Cells With 29.8% 1-Sun Efficiency," IEEE Journal of Photovoltaics, vol. 6, No. 4, Jul. 2016, pp. 1012-1019.

Essig, S. et al., "Boosting the efficiency of III-V/Si tandem solar cells," 43rd IEEE Photovoltaic Specialists Conference, Jun. 2016, pp. 2040-2042.

Essig, S. et al., "Mechanically stacked 4-terminal III-V/Si tandem solar cells," 44th IEEE Photovoltaics Conference, 2017, 2 pages.

Gee, J. et al., "A 31%-Efficient GaAs/Silicon Mechanically Stacked, Multijunction Concentrator Solar Cell," IEEE Electron Device Letters, 1988, pp. 754-758.

Geisz, J. et al., "Enhanced external radiative efficiency for 20.8% efficient single-junction GaInP solar cells," Applied Physics Letters, vol. 3, 2013, pp. 041118-1 through 041118-5.

Green, M. et al., "Solar cell efficiency tables (version 49), Progress in Photovoltaics: Research and Applications," vol. 25, 2017, pp. 3-13.

Haase, F. et al., "Interdigitated back contact solar cells with polycrystalline silicon on oxide passivating contacts for both polarities," Japanese Journal of Applied Physics, vol. 56, 2017, 5 pages.

Hamon, G. et al., "Direct Growth of Crystalline Silicon on GaAs by Low Temperature PECVD: Towards Hybrid Tunnel Junctions for III-V/Si Tandem Cells," 43rd IEEE Photovoltaics Specialists Conference, Jun. 2016, pp. 1895-1897.

Herasimenka, S. et al., "A Simplified Process Flow for Silicon Heterojunction Interdigitated Back Contact Solar Cells: Using Shadow Masks and Tunnel Junctions," IEEE, 2014, pp. 2486-2490.

Hong, C.Y. et al., "Back-Contacted Thin-Film GaAs Solar Cells," IEEE PVSC Conference, Jun. 5-10, 2016, Portland, Oregon, pp. 3629-3631.

Jain, N. et al., "Development of Lattice-Matched 1.7 eV GaInAsP Solar Cells grown on GaAs by MOVPE," IEEE 43rd Photovoltaic Specialists Conference, 2016, pp. 0046-0051.

Jimeno, J. et al., "Upgrading the Silicon IBC to the 40% efficiency," 2016 IEEE PVSC Conference, 6 pages.

Kanechida, M. et al., "A Vertical Insulated Gate AlGaN/GaN Heterojunction Field-Effect Transistor," The Japan Society of Applied Physics, 2007, 3 pages.

Klein, T. et al., "Transparent Conductive Adhesives for Tandem Solar Cells," 44th IEEE Photovoltaics Conference, 2017, 6 pages.

Liu, H. et al., "The realistic energy yield potential of GaAs-on-Si tandem solar cells: a theoretical case study," Optics Express, vol. 23, No. 7, Apr. 6, 2015, p. A382.

NREL Best Research-Cell Efficiencies Chart, accessed Aug. 23, 2018, https://www.nrel.gpv/pv/assets/images/efficiency-chart.png, 1 page.

Nagashima, T. et al., "Three-Terminal Tandem Solar Cells With a Back-Contact Type Bottom Cell," 28th IEEE Photovoltaic Specialists Conference, 2000, pp. 1193-1196.

Nagashima, T. et al., "Surface Passivation for Germanium and Silicon Back Contact Type Photovoltaic Cells," IEEE 4th World Conference on Photovoltaic Energy, May 2006, pp. 655-658.

Onno, A. et al., "Simulation study of GaAsP/Si tandem solar cells," Solar Energy Materials & Solar Cells, vol. 145, 2016, pp. 206-216.

Richter, A. et al., "Reassessment of the Limiting Efficiency for Crystalline Silicon Solar Cells," IEEE Journal of Photovoltaics, vol. 3, No. 4, Oct. 2013, 8 pages.

Rienacker, M. et al., "Junction Resistivity of Carrier-Selective Polysilicon on Oxide Junctions and Its Impact on Solar Cell Performance," IEEE Journal of Photovoltaics, vol. 7, No. 1, Jan. 2017, pp. 11-14.

Scherff, M., Novel Methode for Preparation of Interdigitated Back Contacted a-Si:H/c-Si Heterojunction Solar Cells, preprint to be published in the proceedings of the 26th European Photovoltaic Solar Energy Conference, Sep. 5-9, 2011, Hamburg, Germany, 5 pages.

Schnabel, M. et al., "III-V/Si Tandem Cells Utilizing Interdigitated Back Contact Si Cells and Varying Terminal Configurations," IEEE 44th Photovoltaic Specialists Conference, 2017, 7 pages.

Takamoto, T. et al., "Mechanism of Zn and Si diffusion from a highly doped tunnel junction for InGaP/GaAs tandem solar cells," Journal of Applied Physics, vol. 85, No. 3, Feb. 1, 1999, 6 pages.

Tomasi, A. et al., "Photolithography-free Interdigitated Back-Contacted Silicon Heterojunction Solar Cells with Efficiency > 21%," IEEE, 2014, pp. 3644-3648.

Warren, E. et al., "Modeling three-terminal III-V/Si tandem solar cells," submitted to 44th IEEE Photovoltaics Conference, 2017, 4 pages.

Yang, G. et al., "IBC c-Si solar cells based on ion-implanted poly-silicon passivating contacts," Solar Energy Materials & Solar Cells, vol. 158, 2016, pp. 84-90.

Yoshikawa, K. et al., "6 inch High Efficiency Back Contact Crystalline Si Solar Cell Applying Heterojunction and Thinfilm Technology," 43rd Photovoltaic Specialists Conference, Jun. 2016, pp. 3366-3369.

* cited by examiner

METHODS OF FORMING INTERDIGITATED BACK CONTACT LAYERS

CROSS-REFERENCE TO RELATED APPLICATION

This application claims priority under 35 U.S.C. § 119 to U.S. Provisional Patent Application No. 62/522,777 filed on Jun. 21, 2017, the contents of which are hereby incorporated by reference in their entirety.

CONTRACTUAL ORIGIN

The United States Government has rights in this invention under Contract No. DE-AC36-08GO28308 between the United States Department of Energy and Alliance for Sustainable Energy, LLC, the Manager and Operator of the National Renewable Energy Laboratory.

BACKGROUND

The present invention relates to methods of forming interdigitated back contact (IBC) layers that may be used in photovoltaic (PV) devices. IBC solar cells are the most efficient Si solar cells today. In IBC solar cells, both junctions that collect positive and negative photocarriers are on the back of the cell, while the front has no grid and thus no shading losses. However, the dopant patterning required for these back junctions is challenging. Heavily doped p-type and heavily doped n-type regions should be separated by a highly resistive gap that may be made of intrinsic polysilicon or another dielectric material, otherwise the cell may be shunted. Further, the doped regions should be several hundred microns wide with well-defined edges, in order not to shunt across the undoped gap. Thus, reliable, precise, and inexpensive dopant patterning is needed for IBC solar cells.

Related art dopant patterning techniques include ion implantation through a mask, plasma immersion ion implantation (PIII) through a mask, and printed spin-on doping. However, these techniques can be costly, and may not be clean enough to enable high-efficiency IBC solar cells. Therefore, it would be advantageous to provide a simple, inexpensive, and precise dopant pattering technique that is compatible with solar cell processing.

SUMMARY

Exemplary embodiments of the invention provide methods of forming IBC layers. According to an aspect of the invention, a method includes forming a first layer having alternating regions of n-type amorphous hydrogenated silicon and p-type amorphous hydrogenated silicon on a second layer including intrinsic amorphous hydrogenated silicon. The method also includes annealing the first layer and the second layer such that dopants from the first layer diffuse into the second layer, and the first layer and the second layer crystallize into polysilicon. The annealing may be performed at a temperature greater than 650° C.

Before the forming of the first layer, the second layer may be deposited on a third layer comprising silicon oxide. The first layer may be formed by using a first shadow mask to deposit the regions of the n-type amorphous hydrogenated silicon, and using a second shadow mask to deposit the regions of the p-type amorphous hydrogenated silicon.

Before the annealing, the first layer may include gaps between adjacent regions of the n-type amorphous hydrogenated silicon and the p-type amorphous hydrogenated silicon. After the annealing, the second layer may include alternating regions of n-type polycrystalline silicon, intrinsic polycrystalline silicon, and p-type polycrystalline silicon. The first layer may be formed by plasma-assisted chemical vapor deposition (PECVD).

In an aspect, disclosed is a method for using a deposited mask to form a layer of polycrystalline silicon with alternating doping types in a photovoltaic device having interdigitated back contact layers, the method includes blanketing with i/a-Si:H+SiNx; patterning and etching; removing photoresist; adding p/a-Si:H+SiNx; blanketing with n/a-Si:H+SiNx; precrystallizing; crystallizing a-Si:H into polySi; and diffusing a dopant. In an embodiment, the method also includes blanketing with i/a-Si:H+SiNx+i/aSi:H.

In another aspect, disclosed is a method for using a shadow mask to form a layer of polycrystalline silicon with alternating doping types in a photovoltaic device having interdigitated back contact layers, the method includes depositing i/a-Si:H; patterning a n/a-SiH deposition; patterning a p/a-Si:H deposition; crystallizing; and diffusing a dopant.

Other objects, advantages, and novel features of the present invention will become apparent from the following detailed description of the invention when considered in conjunction with the accompanying drawings.

BRIEF DESCRIPTION OF THE DRAWINGS

FIGS. 1A, 1B, 1C, 1D, 1E, 1F, 1G, 1H, 1I and 1J depict a method of using a deposited mask to form a layer of polycrystalline silicon with alternating doping types according to a first embodiment of the invention.

FIGS. 2A, 2B, 2C, 2D, 2E, 2F, 2G, 2H, 2I and 2J depict a method of using a deposited mask to form a layer of polycrystalline silicon with alternating doping types according to the first embodiment of the invention.

FIGS. 3A, 3B, 3C, 3D, 3E, 3F, 3G, and 3H, depict a method of using yet another method of using a deposited mask to form a layer of polycrystalline silicon with alternating doping types according to the first embodiment of the invention.

FIGS. 4A, 4B, 4C, and 4D depict a method of using a shadow mask to form a layer of polycrystalline silicon with alternating doping types according to a second embodiment of the invention.

FIGS. 5A and 5B depict the passivation quality of intrinsic polycrystalline $Si/SiO_2$ structures formed on n-Cz wafers according to exemplary embodiments of the invention. FIGS. 5A and 5B depict passivation quality of intrinsic poly-$Si/SiO_2$ structures on KOH-planarized n-Cz wafers. FIG. 5B depicts a-Si:H thickness series. The passivation is characterized by the iVoc after an 850° C. crystallization anneal and H-passivation by $Al_2O_3$.

FIGS. 6A and 6B depict characteristics of high performance p-type and n-type passivated contacts that are produced according to exemplary embodiments of the invention.

FIGS. 7A and 7B depict characteristics of an amorphous hydrogenated silicon film that was produced according to the second embodiment of the invention.

FIG. 8 depicts an image of an IBC cell that was produced according to the first embodiment of the invention.

DETAILED DESCRIPTION

Exemplary embodiments of the invention provide methods of forming layers having alternating regions of n-type polycrystalline silicon and p-type polycrystalline silicon. A first layer having alternating regions of n-type amorphous hydrogenated silicon and p-type amorphous hydrogenated silicon is formed on a second layer of intrinsic amorphous hydrogenated silicon. The first layer may be formed by various methods, as discussed below with regard to the first and second embodiments. The first layer and the second layer are then annealed, such that dopants from the first layer diffuse into the second layer, and the first layer and the second layer crystallize into polysilicon.

Figure 1A:
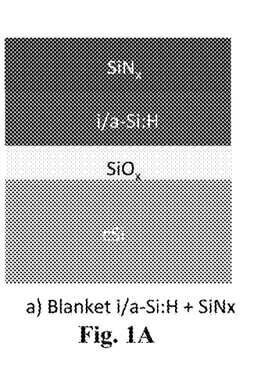
FIG. 1A depicts a step of blanketing i/a-Si:H+SiNx.

In a first embodiment, a deposited mask is used to form a layer of heavily doped amorphous silicon with alternating doping types. As shown in FIG. 1A, the method begins with a structure that includes a crystalline silicon (cSi) substrate on which a silicon oxide ($SiO_x$) layer that serves as a tunneling oxide layer is formed. The $SiO_x$ layer may have a thickness of approximately 1.5 nm, and may be grown thermally at a temperature of 700° C. Plasma-assisted chemical vapor deposition (PECVD) may be used to perform the various deposition steps discussed below.

Figure 1B:
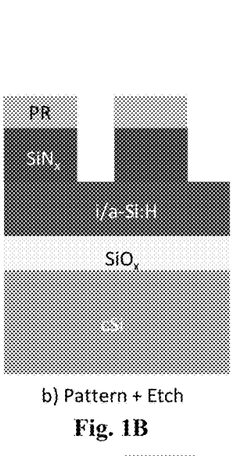
FIG. 1B depicts a step of patterning and etching.

In a first step shown in FIG. 1A, an intrinsic amorphous hydrogenated silicon (i/a-Si:H) layer is deposited on the $SiO_x$ layer. The i/a-Si:H layer may have a thickness of at least 20 nm. This layer is then covered with a deposited film such as silicon nitride ($SiN_x$), $Al_2O_3$, $SiO_x$, or combinations thereof. The deposited film is shown in FIG. 1A as a first $SiN_x$ layer. In a second step shown in FIG. 1B, a first photoresist (PR) is patterned via any suitable lithographic technique on a portion of the first $SiN_x$ layer. The exposed portion of the first $SiN_x$ layer is etched via wet chemistry such as dilute hydrofluoric acid (HF), and the PR is subsequently removed by a solvent such as acetone.

Figure 1C:
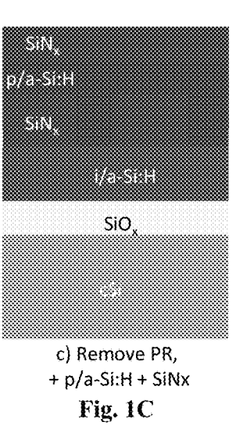
FIG. 1C depicts a step of removing photoresist (PR) and adding p/a-Si:H+SiNx.

In a third step shown in FIG. 1C, the first PR is completely removed, and a p-type amorphous hydrogenated silicon (p/a-Si:H) layer is deposited on the structure, where portions of the p/a-Si:H layer are in direct contact with the i/a-Si:H layer. The p/a-Si:H layer may be doped with any suitable p-type dopant, such as B. The p/a-Si:H layer may have a thickness of at least 5 nm, and may have a dopant concentration of approximately $10^{21}$ $cm^{-3}$. A second $SiN_x$ layer is then deposited on the p/a-Si:H layer.

Figure 1D:
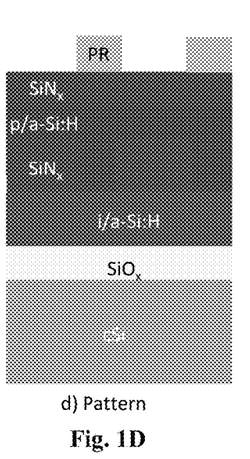
FIG. 1D depicts a step of patterning.
Figure 1E:
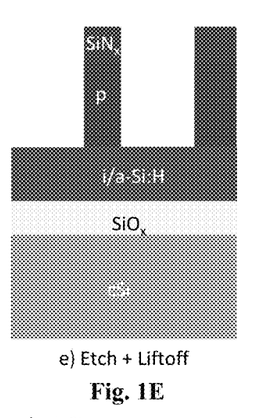
FIG. 1E depicts a step of etching and liftoff.

In a fourth step shown in FIG. 1D, a second PR is patterned on portions of the second $SiN_x$ layer to protect the part of the underlying p/a-Si:H layer that is in direct contact with the i/a-Si:H layer. In a fifth step shown in FIG. 1E, portions of the second $SiN_x$ layer, the p/a-Si:H layer, and the first $SiN_x$ layer that are not covered by the second PR are etched by any suitable method, such as exposing the structure to reactive ion etching (RIE) or wet chemistry (HF). The second PR is then removed.

Figure 1F:
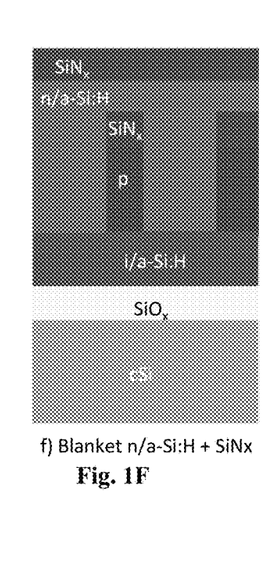
FIG. 1F depicts a step of blanketing with n/a-Si:H+SiNx.
Figure 1G:
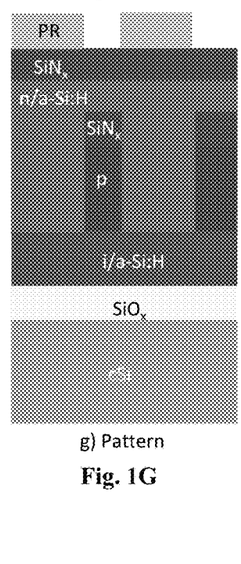
FIG. 1G depicts a step of patterning.
Figure 1H:
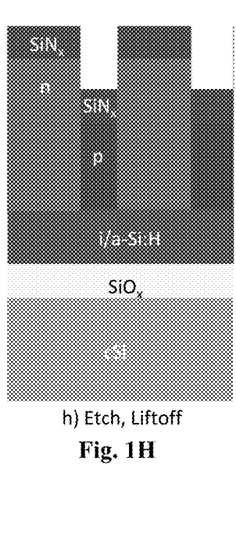
FIG. 1H depicts a step of etching and liftoff.

In a sixth step shown in FIG. 1F, an n-type amorphous hydrogenated silicon (n/a-Si:H) layer is deposited on the structure, and a third $SiN_x$ layer is formed on the n/a-Si:H layer. The n/a-Si:H layer may be doped with any suitable n-type dopant, such as P. The n/a-Si:H layer may have a thickness of at least 5 nm, and may have a dopant concentration of approximately $10^{21}$ $cm^{-3}$. In a seventh step shown in FIG. 1G, a third PR is patterned on portions of the third $SiN_x$ layer to protect the part of the underlying n/a-Si:H layer that is in direct contact with the i/a-Si:H layer. In an eighth step shown in FIG. 1H, the portions of the third $SiN_x$ layer and the n/a-Si:H layer that are not covered by the third PR are etched by any suitable method, such as exposing the structure to reactive ion etching (RIE) or wet chemistry (HF). The third PR is then removed.

Figure 1I:
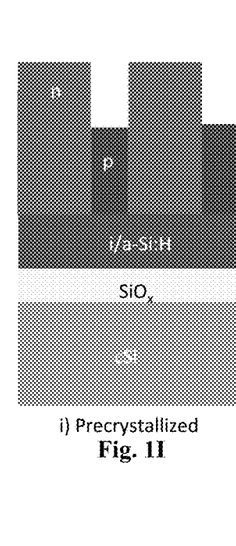
FIG. 1I depicts a step of precrystallizing.
Figure 1J:
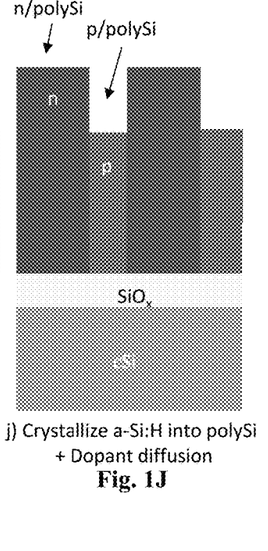
FIG. 1J depicts a step of crystallizing a-Si:H into polySi and dopant diffusion.
Figure 2A:
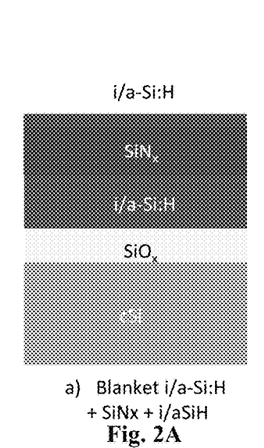
FIG. 2A depicts a step of blanketing i/a-Si:H+SiNx+i/aSi:H.
Figure 2B:
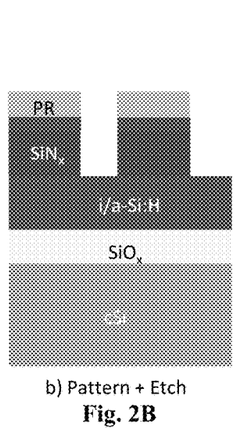
FIG. 2B depicts a step of patterning and etching.
Figure 2C:
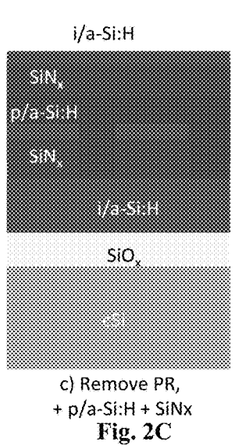
FIG. 2C depicts a step of removing PR and adding p/a-Si:H+SiNx.
Figure 2D:
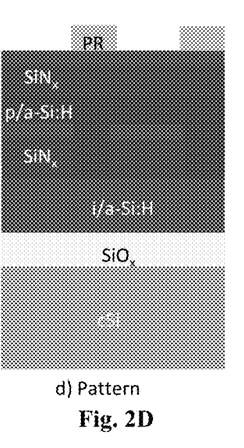
FIG. 2D depicts a step of patterning.
Figure 2E:
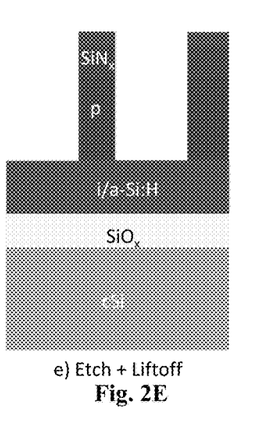
FIG. 2E depicts a step of etching and liftoff.
Figure 2F:
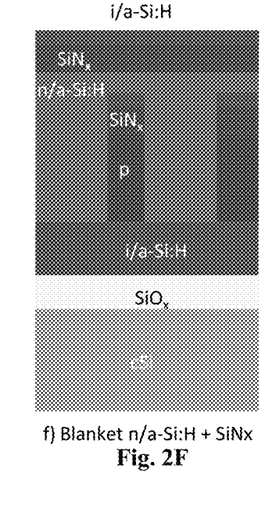
FIG. 2F depicts a step of blanketing with n/a-Si:H+SiNx.
Figure 2G:
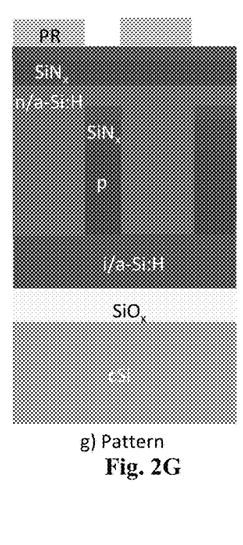
FIG. 2G depicts a step of patterning.
Figure 2H:
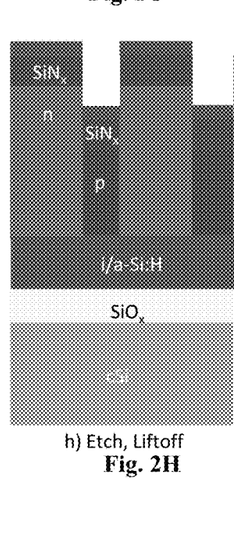
FIG. 2H depicts a step of etching and liftoff.
Figure 2I:
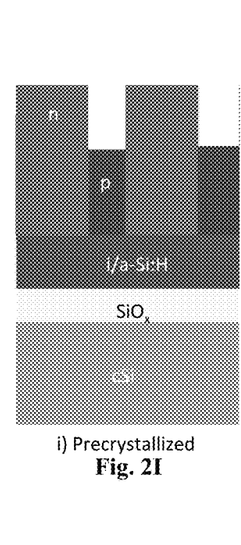
FIG. 2I depicts a step of precrystallizing.
Figure 2J:
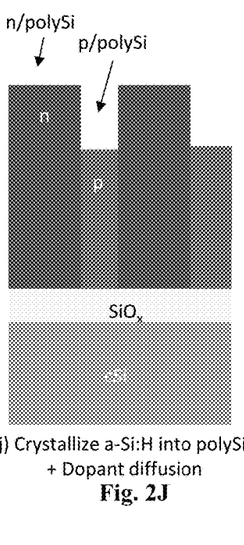
FIG. 2J depicts a step of crystallizing a-Si:H into polySi and dopant diffusion.

In a ninth step shown in FIG. 1I, the remaining sections of the second and third $SiN_x$ layers are removed by any suitable method, such as etching with HF. In a tenth step shown in FIG. 1J, the structure is annealed at high temperatures, such as greater than 650° C., which effuses hydrogen and causes dopants from the n/a-Si:H and p/a-Si:H regions to diffuse into the i/a-Si:H layer, while all of the remaining layers in the structure (except for the $SiO_x$ and cSi layers) crystallize into polysilicon. This forms alternating regions of n-type polycrystalline silicon (n/polySi) and p-type polycrystalline silicon (p/polySi). The n-type and p-type regions may have the same or different widths. The $SiO_x$ layer allows for the high temperatures that are used during annealing to drive the dopants into the i/a-Si:H layer.

The deposited mask approach of the first embodiment may be modified in various ways. For example, as shown in FIGS. 2A through 2J, additional masking layers may be formed on the $SiN_x$ layers. The selection of the material for the masking layers is subject to the desired chemistries to be used to etch, since etching selectivity is material dependent. For example, photoresist does not etch with RIE, while a-Si:H does etch with RIE. Similarly, a-Si:H does not etch with HF, while $SiN_x$, $Al_2O_3$, and $SiO_x$ do etch with HF. The additional masking layers shown in FIG. 2 are intrinsic amorphous silicon (i/a-Si:H) layers. The steps performed in FIGS. 2A-2J may be the same as the steps described above with regard to FIGS. 1A-1J, respectively.

Figure 3A:
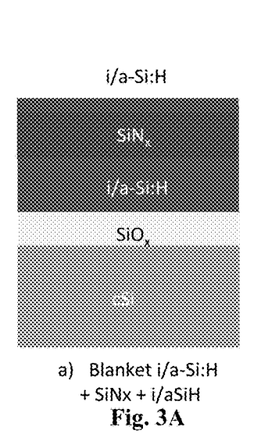
FIG. 3A depicts a step of blanketing i/a-Si:H+SiNx+i/aSi:H.
Figure 3B:
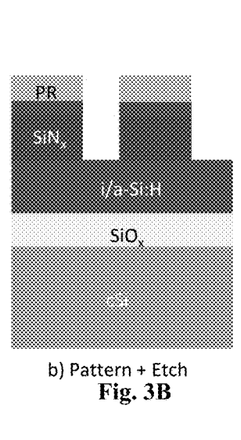
FIG. 3B depicts a step of patterning and etching.
Figure 3C:
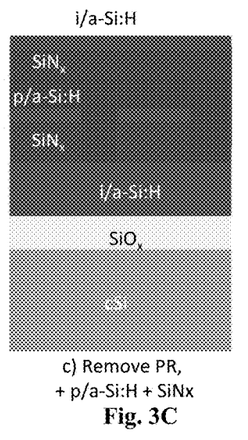
FIG. 3C depicts a step of removing PR and adding p/a-Si:H+SiNx.
Figure 3D:
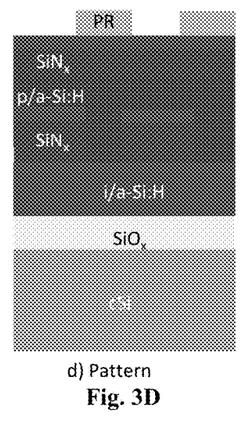
FIG. 3D depicts a step of patterning.
Figure 3E:
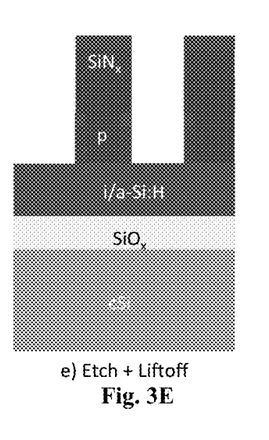
FIG. 3E depicts a step of etching and liftoff.
Figure 3F:
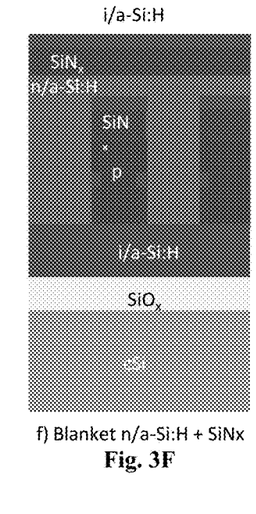
FIG. 3F depicts a step of blanketing with n/a-Si:H+SiNx.
Figure 3G:
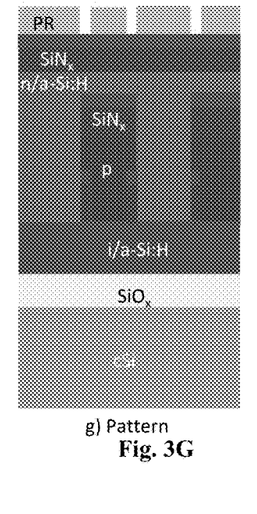
FIG. 3G depicts a step of patterning.
Figure 3H:
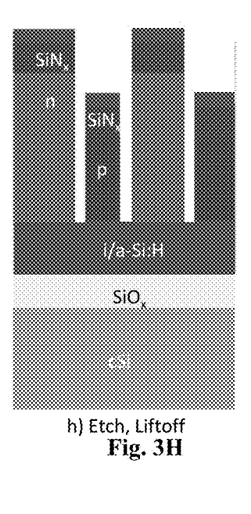
FIG. 3H depicts a step of etching and liftoff.
Figure 3I:
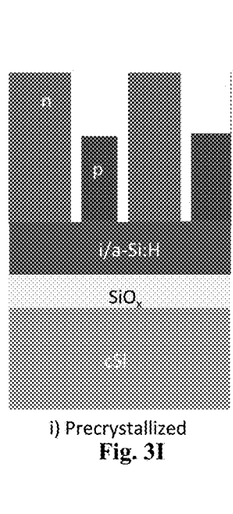
FIG. 3I depicts a step of precrystallizing.
Figure 3J:
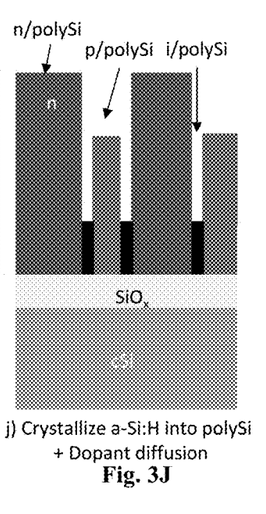
FIG. 3J depicts a step of crystallizing a-Si:H into polySi and dopant diffusion.

Further, as shown in FIGS. 3A-3H, the patterning of the doped layers may be modified to provide an undoped gap between adjacent doped layers. For example, the second PR that is deposited in the fourth step shown in FIG. 3D may be widened, such that portions of the first $SiN_x$ layer and the additional masking layer remain. The third PR is used as a mask in the seventh step shown in FIG. 3G, such that after the portions are etched away during the eighth step shown in FIG. 3H, a space is formed between the n/a-Si:H and p/a-Si:H regions. In the tenth step shown in FIG. 3J, the structure is annealed at high temperatures, such as greater than 650° C., which effuses hydrogen and causes dopants from the n/a-Si:H and p/a-Si:H regions to diffuse into the i/a-Si:H layer, while the n/a-Si:H, p/a-Si:H, and i/a-Si:H layers crystallize into polysilicon. This forms alternating regions of n-type polycrystalline silicon (n/polySi), intrinsic polycrystalline silicon (i/polySi), and p-type polycrystalline silicon (p/polySi). The steps performed in FIGS. 3A-3J may be the same as the steps described above with regard to FIGS. 1A-1J, respectively.

Figures 4A, 4B:
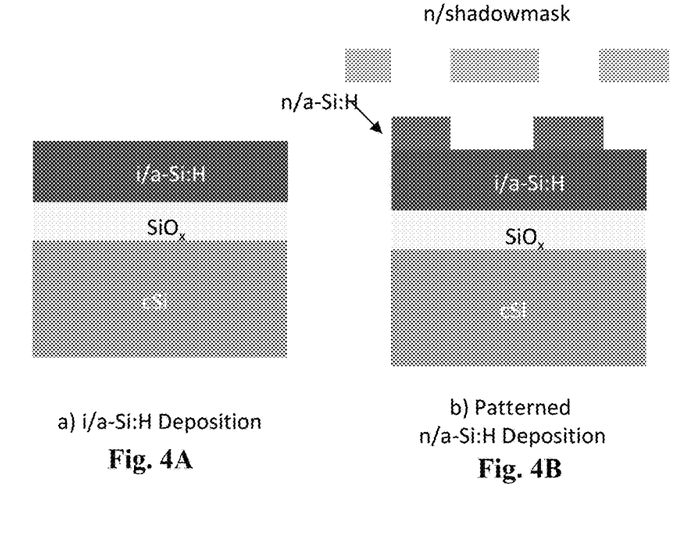
FIG. 4A depicts a step of i/a-Si:H deposition.
FIG. 4B depicts a step of patterned n/a-SiH deposition.

In a second embodiment, a shadow mask is used to form a layer of heavily doped amorphous silicon with alternating doping types. For example, the shadow mask may be made of a perforated metal sheet or a Si wafer that is patterned by laser-initiated etching. As shown in FIG. 4A, the method begins with a structure that includes a crystalline silicon (cSi) substrate on which a silicon oxide ($SiO_x$) layer that serves as a tunneling oxide layer is formed. The $SiO_x$ layer may have a thickness of approximately 1.5 nm, and may be grown thermally at a temperature of 700° C. PECVD may be used to perform the various deposition steps discussed below.

In a first step shown in FIG. 4A, an intrinsic amorphous hydrogenated silicon (i/a-Si:H) layer is deposited on the $SiO_x$ layer. The i/a-Si:H layer may have a thickness of at least 20 nm. In a second step shown in FIG. 4B, a first shadow mask (n/shadowmask) is used to deposit an n-type amorphous hydrogenated silicon (n/a-Si:H) layer on regions of the i/a-Si:H layer. The n/a-Si:H layer may be doped with any suitable n-type dopant, such as P. The n/a-Si:H layer may have a thickness of at least 5 nm, and may have a dopant concentration of approximately $10^{21}$ $cm^{-3}$. In a third step shown in FIG. 4C, a second shadow mask (p/shadowmask) is used to deposit a p-type amorphous hydrogenated silicon (p/a-Si:H) layer on other regions of the i/a-Si:H layer. The p/a-Si:H layer may be doped with any suitable p-type dopant, such as B. The p/a-Si:H layer may have a thickness of at least 5 nm, and may have a dopant concentration of approximately $10^{21}$ $cm^{-3}$. The p/a-Si:H regions alternate with the n/a-Si:H regions, and spaces having a width between approximately 50 μm and approximately 100 μm may be formed between adjacent p/a-Si:H and n/a-Si:H regions. Although the shadow masks are shown as being spaced apart from the i/a-Si:H layer in FIGS. 4B and 4C, the shadow masks may be in direct contact with the i/a-Si:H layer during deposition. The shadow masks may provide an edge roughness and pattern fidelity of approximately 10 μm.

Figures 4C, 4D:
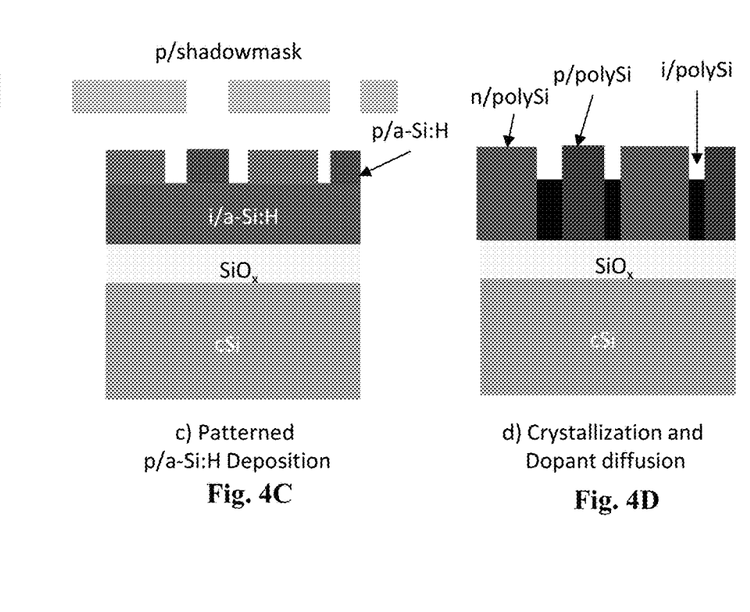
FIG. 4C depicts a step of patterned p/a-Si:H deposition.
FIG. 4D depicts a step of crystallization and dopant diffusion.

In a fourth step shown in FIG. 4D, the structure is annealed at high temperatures, such as greater than 650° C., which effuses hydrogen and causes dopants from the n/a-Si:H and p/a-Si:H regions to diffuse into the i/a-Si:H layer, while the n/a-Si:H, p/a-Si:H, and i/a-Si:H layers crystallize into polysilicon. This forms alternating regions of n-type polycrystalline silicon (n/polySi), intrinsic polycrystalline silicon (i/polySi), and p-type polycrystalline silicon (p/polySi). The n-type and p-type regions may have the same or different widths. The $SiO_x$ layer allows for the high temperatures that are used during annealing to drive the dopants into the i/a-Si:H layer.

In both embodiments, the resulting structure may then receive an atomic layer deposited (ALD) $Al_2O_3$ layer with an additional $SiN_x$ layer deposited by PECVD on the textured front surface. A subsequent forming gas anneal (FGA) at approximately 400° C. may further passivate the structure by hydrogenation and field effects. After removal of the sacrificial $Al_2O_3$ layer from the back, the IBC structure may be metallized by thermal evaporated Al through a Si wafer shadow mask or a lithographically defined patterned photoresist. The emitter and back surface field (BSF) contacts, as well as the intrinsic poly-Si gap layers, may be optimized separately using symmetric test structures. These may be deposited on planarized and tunnel-oxidized n-Cz wafers.

Figure 5A:
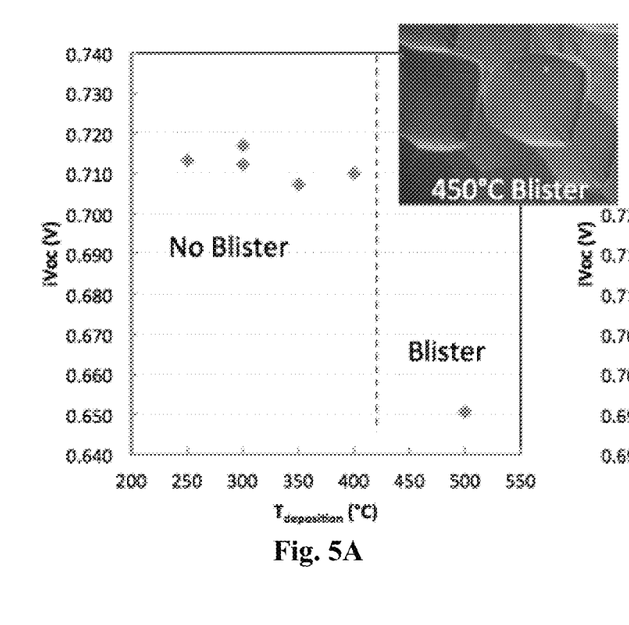
FIG. 5A depicts intrinsic a-Si:H deposition temperature series.
Figure 5B:
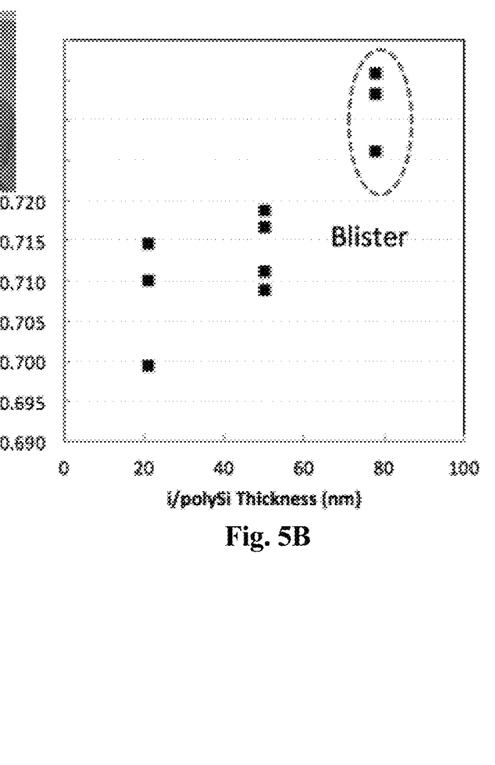

To test the methods discussed above, symmetric lifetime structures were grown and measured. Before depositing doped source layers for n- and p-type passivated contacts, intrinsic poly-Si/$SiO_2$ structures with high surface passivation were developed. These underwent the same thermal treatments and passivation by ALD $Al_2O_3$ as the sandwich-doped layers. The best degree of passivation of i/poly-Si/$SiO_2$ was obtained using a high hydrogen dilution $H_2/SiH_4$ ratio during PECVD deposition of i/a-Si:H at a low rate less than 0.5 Å/s. Other factors are the deposition temperature and the i/a-Si:H film thickness, as summarized in FIG. 5. Thicker a-Si:H layers produce better surface passivation but develop blisters during 850° C. annealing. These do not affect the implied open-circuit voltage ($iV_{oc}$) initially but cause performance loss upon further cell processing. In contrast, depositing a-Si:H at a temperature greater than 400° C. already produces films with blisters (see inset of FIG. 5A), resulting in a low $iV_{oc}$.

Figure 6A:
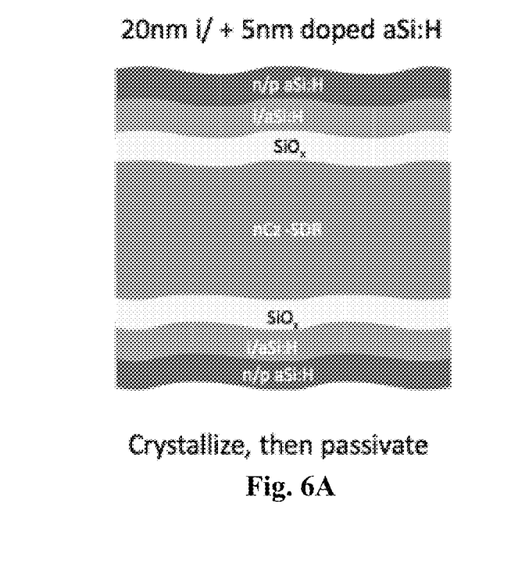
FIG. 6A depicts symmetric sandwich structures as precursors to passivated contacts.
Figure 6B:
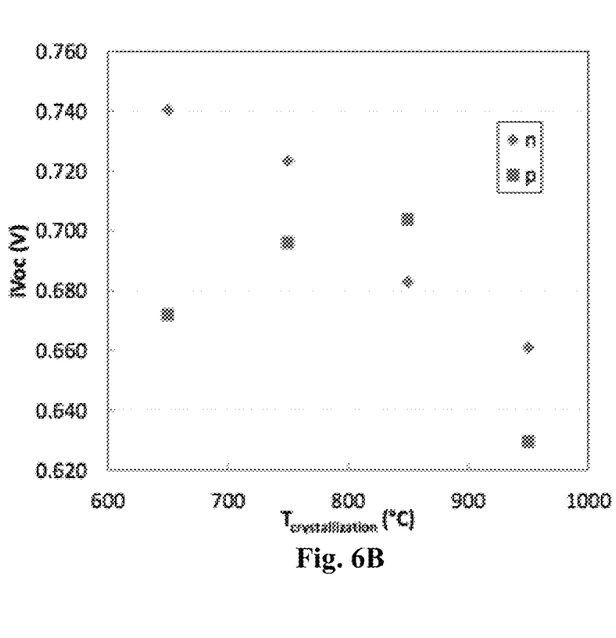
FIG. 6B depicts $iV_{oc}$ of these structures after crystallization/drive-in anneal at various temperatures, followed by passivation with $Al_2O_3$ as H-source layer.

After selecting the i/poly-Si process with a 20 nm thick film deposited at 300° C. under optimal PECVD conditions, heavily doped n-type or p-type a-Si:H was deposited. The dopants were then driven into the rest of the poly-Si by thermal diffusion, with a goal of producing the average dopant concentrations within poly-Si of approximately $2 \times 10^{20}$ $cm^{-3}$. As seen from FIG. 6, high performance p-type and n-type passivated contacts can be produced by this method. Notably, the typically more problematic p-type passivated contacts exhibit an $iV_{oc}$ over 700 mV after this processing. This might be associated with less accumulation of B into the tunneling oxide after diffusion through the poly-Si layer. The n-type contact has a remarkably high $iV_{oc}$ after annealing at 650° C. but deteriorates with increasing the annealing temperature. This is somewhat unexpected since uniformly doped n-type contacts after annealing at 850° C. and passivation typically show an $iV_{oc}$ greater than 730 mV peaking near the 850° C. anneal temperature. The above effect might be due to an overall amount of P that is too low, leading to a reduced field effect passivation.

In-plane 2D spatial patterning of B and P dopants was also investigated. For this purpose, dopant-source layers shown in FIG. 6A were deposited by spatially-masked PECVD using (i) a mechanical mask as described above with regard to the second embodiment and (ii) photolithographically patterned, sacrificial dielectric layers on top of the blanket intrinsic a-Si:H as described above with regard to the first embodiment.

Figure 7A:
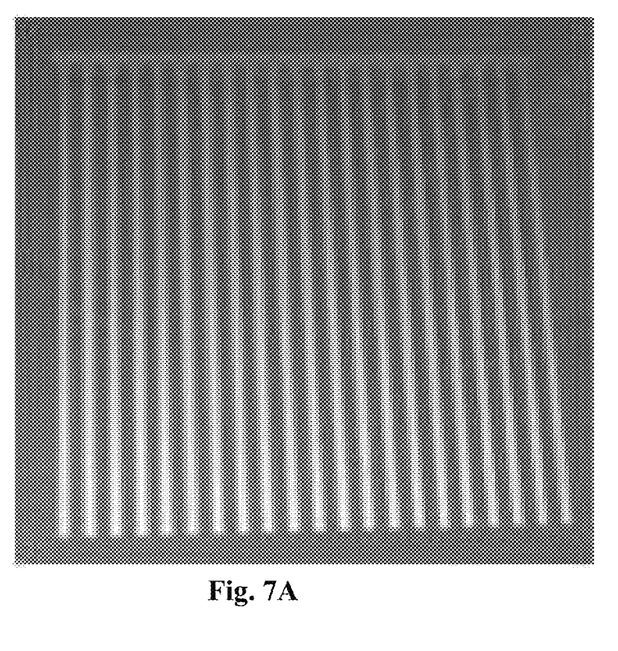
FIG. 7A depicts a-Si:H film deposited on quartz through the BSF finger mask of the IBC cell.
Figure 7B:
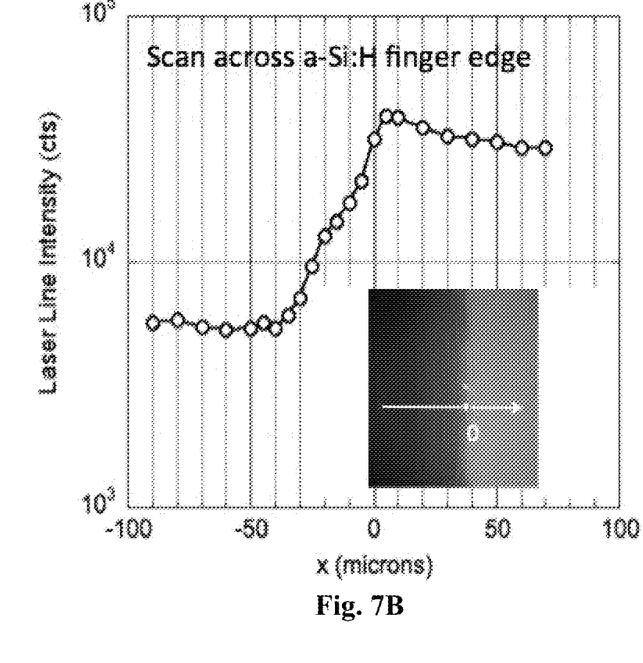
FIG. 7B depicts spatial edge fidelity of the BSF finger resolved by optical microreflectance scan.

To ensure the absence of edge effects during PECVD, patterned Si wafers were used as shadow masks for the dopant source overlayers in an example based on the second embodiment. FIG. 7A shows the resulting pattern of an approximately 10 nm thick a-Si:H layer deposited on quartz through the n-type finger (BSF) mask of the 2×2 $cm^2$ IBC cell. In this example, the a-Si:H finger edge fidelity was approximately 17 measured as the exponential decay length of the optical microreflectance scan (FIG. 7B). Taking into account that the poly-Si resistivity increases highly nonlinearly with doping below $10^{19}$ cm$^{-3}$, this suggests that the 100 μm wide intrinsic poly-Si gap will remain insulating between the n-type and p-type fingers. This is important because the weak shuntage criterion for an IBC cell ($R_{shunt}$/$R_{char}$>100) holds only if the sheet resistivity of the i/poly-Si gap is on the order of MSΩ/□, as the total gap length even in a 2×2 cm$^2$ cell is about 80 cm. Note that unlike the diffused IBC cells, the poly-Si contact based IBC cell is easily shunted due to the ohmic behavior of junctions between heavily doped and defective i-type, n-type, and p-type poly-Si layers.

Figure 8:
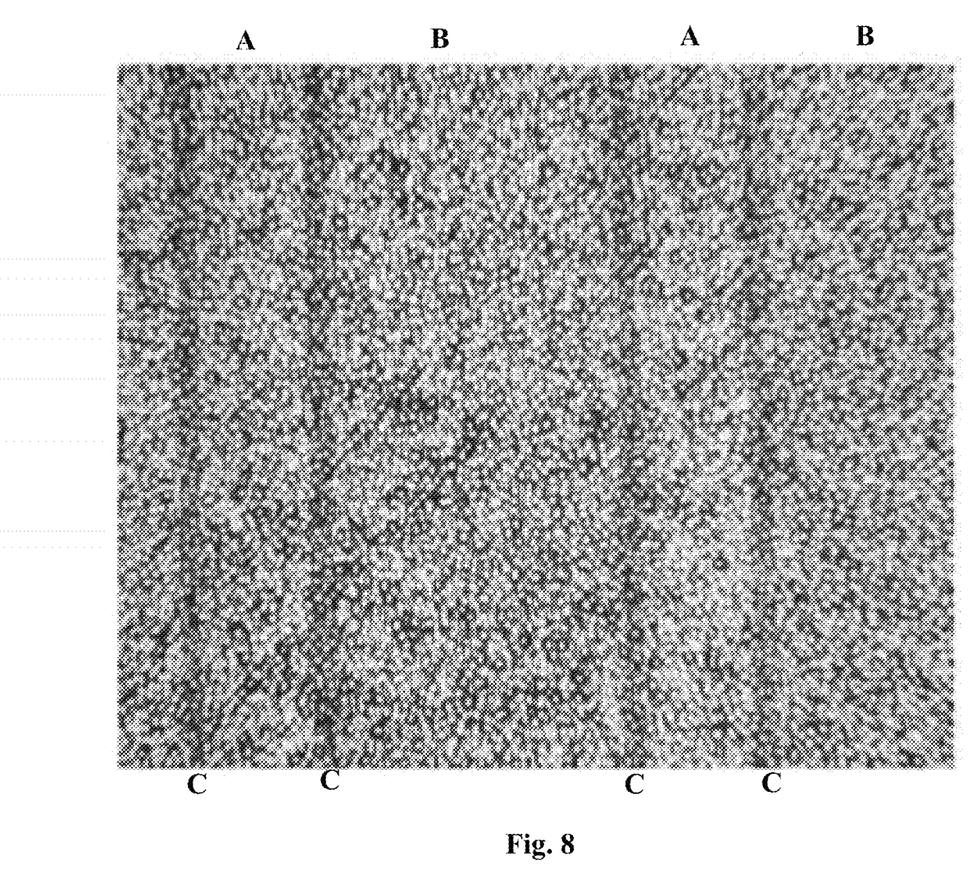
FIG. 8 depicts an image of premetallized, lithography-defined IBC cell with BSF (blue region labelled as A), emitter (yellow region labelled as B), and gap (pink region labelled as C) clearly defined.

Patterning dopant source layers was also done using dielectric layers to protect intrinsic a-Si:H during doped a-Si:H PECVD, with lithography steps in between n-type and p-type depositions in an example based on the first embodiment. As shown in FIG. 8, this technique provides excellent edge fidelity. However, this process is more complex than the high-throughput mechanical masking of the second embodiment.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method comprising:
    forming a first layer comprising alternating regions of n-type amorphous hydrogenated silicon and p-type amorphous hydrogenated silicon on a second layer comprising intrinsic amorphous hydrogenated silicon; and
    diffusing such that dopants from the first layer diffuse into the second layer;
    and crystallizing the first layer and the second layer into polysilicon by annealing the first layer and the second layer at a temperature between 650° C. and 850° C.;
    and wherein before the forming of the first layer, depositing the second layer on a third layer comprising silicon oxide;
    and wherein before the annealing, the first layer further comprises gaps between adjacent regions of the n-type amorphous hydrogenated silicon and the p-type amorphous hydrogenated silicon:
    and wherein, after the annealing, the second layer comprises alternating regions of n-type polycrystalline silicon, intrinsic polycrystalline silicon, and p-type polycrystalline silicon;
    and wherein the first layer is formed by plasma-assisted chemical vapor deposition (PECVD).

2. The method according to claim 1, wherein the first layer is formed by:
    using a first shadow mask to deposit the regions of the n-type amorphous hydrogenated silicon; and
    depositing the regions of the p-type amorphous hydrogenated silicon using a second shadow mask.

3. A method for using a shadow mask to form a layer of polycrystalline silicon with alternating doping types in a photovoltaic device comprising interdigitated back contact layers of a first layer comprising alternating regions of n-type amorphous hydrogenated silicon and p-type amorphous hydrogenated silicon and further comprising a second layer comprising intrinsic amorphous hydrogenated silicon; and
    wherein the method comprises crystallizing and diffusing a dopant by annealing the first layer and the second layer at a temperature between 650° C. and 850° C.; and
    wherein the method further comprises depositing a second layer comprising intrinsic amorphous hydrogenated silicon; patterning a first layer comprising alternating regions of n-type amorphous hydrogenated silicon and p-type amorphous hydrogenated silicon;
    and wherein, before the forming of the first layer, depositing the second layer on a third layer comprising silicon oxide;
    and wherein the first layer is formed by depositing the regions of the n-type amorphous hydrogenated silicon by using a first shadow mask; and
    depositing the regions of the p-type amorphous hydrogenated silicon by using a second shadow mask;
    and wherein, before the annealing, the first layer further comprises gaps between adjacent regions of the n-type amorphous hydrogenated silicon and the p-type amorphous hydrogenated silicon.

* * * * *